(12) United States Patent
Huang et al.

(10) Patent No.: US 11,929,138 B2
(45) Date of Patent: Mar. 12, 2024

(54) RECOVERY MANAGEMENT OF RETIRED SUPER MANAGEMENT UNITS

(71) Applicant: Micron Technology, Inc., Boise, ID (US)

(72) Inventors: Jian Huang, Union City, CA (US); Zhenming Zhou, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/452,717

(22) Filed: Oct. 28, 2021

(65) Prior Publication Data

US 2022/0051749 A1 Feb. 17, 2022

Related U.S. Application Data

(63) Continuation of application No. 16/510,778, filed on Jul. 12, 2019, now Pat. No. 11,183,267.

(51) Int. Cl.
*G11C 29/00* (2006.01)
*G11C 29/38* (2006.01)
*G11C 29/44* (2006.01)

(52) U.S. Cl.
CPC .............. *G11C 29/88* (2013.01); *G11C 29/38* (2013.01); *G11C 29/44* (2013.01)

(58) Field of Classification Search
CPC .. G06F 11/079; G06F 11/0793; G06F 3/0679; G06F 11/0706; G06F 11/0751; G06F 11/20; G06F 12/08; G06F 21/76; G06F 3/0643; G06F 3/0644; G06F 12/1009; G06F 12/1027; G06F 12/109; G06F 2212/1016; G06F 2212/401; G06F 3/0604; G06F 3/0608; G06F 3/0632; G06F 3/0664; G06F 3/067; G06F 11/0754; G06F 11/1068; G06F 3/0689; G06F 9/45558;

(Continued)

(56) References Cited

U.S. PATENT DOCUMENTS 5,373,509 A 12/1994 Katsura
7,171,536 B2 1/2007 Chang et al.
(Continued)

FOREIGN PATENT DOCUMENTS

CN 101354915 A 1/2009
KR 20170032424 A 3/2017

OTHER PUBLICATIONS

PCT International Search Report and Written Opinion for International Application No. PCT/US2020/041706, dated Oct. 21, 2020, 11 pages.

*Primary Examiner* — Steve N Nguyen
(74) *Attorney, Agent, or Firm* — Lowenstein Sandler LLP

(57) ABSTRACT

A system includes a memory component, and a processing device coupled with the memory component. The processing device to identify a group of management units of the memory component, wherein the group of management units is included in a set of retired groups of management units, select a management unit from the group of management units, perform a media integrity check on the management unit to determine a failed bit count of the management unit, and in response to the failed bit count of the management unit failing to satisfy a threshold criterion, remove the group of management units from the set of retired groups of management units.

17 Claims, 6 Drawing Sheets

(58) Field of Classification Search
CPC ............. G06F 11/2094; G06F 12/0253; G06F 2009/4557; G06F 2201/82; G06F 3/064; G06F 3/0647; G06F 3/0665; G06F 8/34; G06F 9/4856; G06F 9/5022; G06F 9/5055; G06F 11/00; G06F 11/0727; G06F 11/073; G06F 11/1441; G06F 11/1484; G06F 11/2015; G06F 12/06; G06F 16/137; G06F 16/1774; G06F 16/1805; G06F 16/1837; G06F 16/1847; G06F 16/1865; G06F 16/24; G06F 16/3329; G06F 1/30; G06F 2003/0697; G06F 21/31; G06F 2209/5018; G06F 3/0614; G06F 3/0617; G06F 3/0619; G06F 3/0623; G06F 3/0629; G06F 3/0659; G06F 3/0671; G06F 3/0688; G06F 40/14; G06F 40/30; G06F 9/30018; G06F 9/3004; G06F 9/30101; G06F 9/30185; G06F 9/3855; G06F 9/4418; G06F 9/442; G06F 9/462; G06F 9/4812; G06F 9/544; G06F 11/10; G06F 11/1004; G06F 11/1008; G06F 11/1012; G06F 11/108; G06F 11/141; G06F 11/1446; G06F 11/1666; G06F 11/362; G06F 12/1466; G06F 13/36; G06F 13/387; G06F 13/4217; G06F 16/25; G06F 16/30; G06F 16/3331; G06F 16/951; G06F 16/9566; G06F 16/958; G06F 2009/45595; G06F 21/41; G06F 21/53; G06F 21/6218; G06F 21/64; G06F 21/645; G06F 21/755; G06F 21/77; G06F 2211/109; G06F 2212/652; G06F 2221/2101; G06F 3/0482; G06F 3/0613; G06F 40/295; G06F 40/35; G06F 40/56; G06F 8/60; G06F 8/61; G06F 8/65; G06F 9/4408; G06F 9/4416; G06F 9/5044; G06F 9/5077; G06F 9/5083; G01R 31/3177; G01R 31/42; G11C 29/832; G11C 16/349; G11C 16/0483; G11C 29/883; G11C 29/88; G11C 11/4096; G11C 16/04; G11C 16/3418; G11C 16/3422; G11C 17/14; G11C 2029/0401; G11C 2029/0407; G11C 2029/0409; G11C 2029/0411; G11C 2029/1208; G11C 29/26; G11C 29/42; G11C 29/52; G11C 29/74; G11C 29/38

See application file for complete search history.

(56) References Cited

U.S. PATENT DOCUMENTS

| | | | |
|---|---|---|---|
| 8,370,720 B2* | 2/2013 | Allen | G06F 12/0246 714/773 |
| 9,183,070 B2 | 11/2015 | Marquart et al. | |
| 9,460,784 B1* | 10/2016 | Pellizzer | G11C 13/004 |
| 10,297,337 B2* | 5/2019 | Tsai | G11C 29/44 |
| 2003/0067697 A1* | 4/2003 | Weinstein | G11B 20/1816 |
| 2005/0120265 A1* | 6/2005 | Pline | G11C 29/76 714/6.32 |
| 2006/0227634 A1* | 10/2006 | Loh | G11C 29/56008 365/201 |
| 2009/0259806 A1 | 10/2009 | Kilzer et al. | |
| 2009/0290418 A1* | 11/2009 | Han | G11C 16/3454 365/185.09 |
| 2010/0122148 A1 | 5/2010 | Flynn et al. | |
| 2010/0293439 A1 | 11/2010 | Flynn et al. | |
| 2011/0119538 A1 | 5/2011 | Ipek et al. | |
| 2011/0188304 A1 | 8/2011 | Chang-Wook et al. | |
| 2011/0283135 A1 | 11/2011 | Burger et al. | |
| 2011/0283166 A1 | 11/2011 | Kim et al. | |
| 2013/0031429 A1* | 1/2013 | Sharon | G06F 11/1048 711/E12.008 |
| 2014/0003167 A1 | 1/2014 | Jung | |
| 2014/0143474 A1 | 5/2014 | Damle et al. | |
| 2014/0258775 A1 | 9/2014 | Flynn et al. | |
| 2016/0180958 A1* | 6/2016 | Raghunathan | G11C 16/14 365/185.24 |
| 2016/0232985 A1 | 8/2016 | Sabde et al. | |
| 2017/0249242 A1 | 8/2017 | Thatcher et al. | |
| 2019/0004893 A1* | 1/2019 | Kwok | G06F 11/1072 |
| 2019/0065331 A1 | 2/2019 | Singidi et al. | |
| 2020/0409808 A1* | 12/2020 | Seetharaman | G11C 29/38 |

\* cited by examiner

RECOVERY MANAGEMENT OF RETIRED SUPER MANAGEMENT UNITS

RELATED APPLICATION

This application is a continuation of U.S. patent application Ser. No. 16/510,778, filed Jul. 12, 2019, which is hereby incorporated in its entirety herein by reference.

TECHNICAL FIELD

Embodiments of the disclosure relate generally to memory sub-systems, and more specifically, relate to recovery management of retired super management units (SMUs).

BACKGROUND

A memory sub-system can be a storage system, a memory module, or a hybrid of a storage device and memory module. The memory sub-system can include one or more memory components that store data. The memory components can be, for example, non-volatile memory components and volatile memory components. In general, a host system can utilize a memory sub-system to store data at the memory components and to retrieve data from the memory components.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
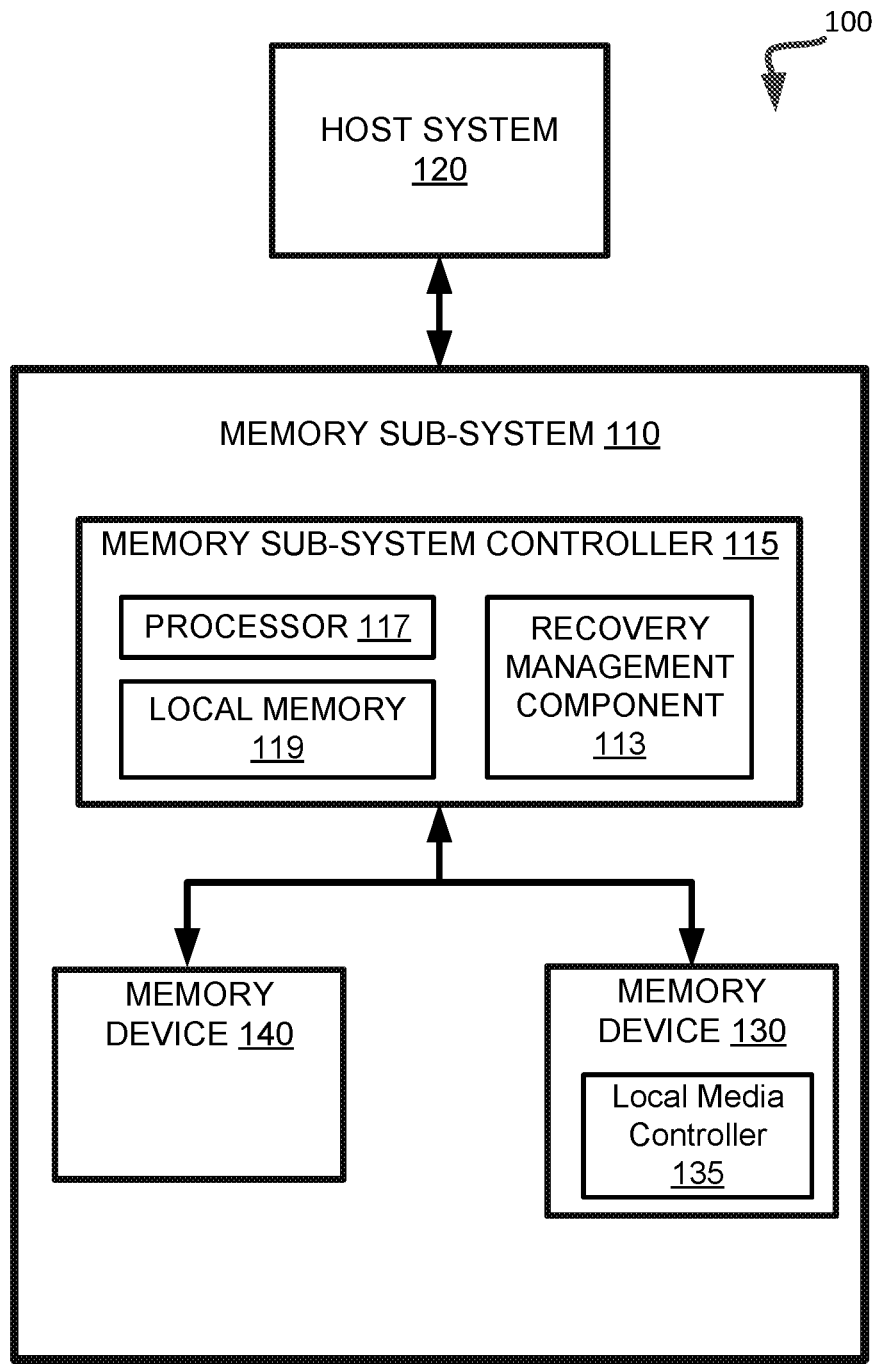
FIG. 1 illustrates an example computing environment that includes a memory sub-system in accordance with some embodiments of the present disclosure.

Aspects of the present disclosure are directed to recovery management of SMUs from a set of retired SMUs. A memory sub-system can be a storage device, a memory module, or a hybrid of a storage device and memory module. Examples of storage devices and memory modules are described below in conjunction with FIG. 1. In general, a host system can utilize a memory sub-system that includes one or more memory components. The host system can provide data to be stored at the memory sub-system and can request data to be retrieved from the memory sub-system.

The memory components can include non-volatile and volatile memory devices. A non-volatile memory device is a package of one or more dice. The dice in the packages can be assigned to one or more channels for communicating with a memory sub-system controller. The non-volatile memory devices include cells (i.e., electronic circuit that stores information), that are grouped into pages to store bits of data.

The non-volatile memory devices can include 3D cross-point ("3D cross-point") memory devices that are a cross-point array of non-volatile memory that can perform bit storage based on a change of bulk resistance, in conjunction with a stackable cross-gridded data access array. Such non-volatile memory devices can group pages across dice and channels to form management units (MUs).

As used herein, a managed unit generally refers to a number of memory cells that are programmed and/or read together or as a functional group. A managed unit may correspond to a logical block size (e.g., a data transfer size of a host and/or a data management size of a memory system), which can be, for example, 4 KB. As an example, a managed unit can be mapped to a physical set of memory cells. However, embodiments are not so limited. For example, a managed unit may correspond to more than a logical block size when a group of memory cells storing user data and overhead data (e.g., data informative of other data stored within the group of memory cells) corresponds to more than a logical block size. A management unit, herein referred to as a management unit (MU), can be a portion of media of the memory sub-system that data can be written to and read from. Although memory devices such as 3D cross-point type memory are described, an MU can be defined for other type of memory, such as negative-and (NAND) and random access memory (RAM), For example, an MU can be a page of data in NAND media or a logical block of data in RAM.

MUs can be grouped into larger groups of data management units referred to herein as a super management unit (SMU). While an MU can be the unit of media that controls decoding and storing of data, an SMU can be used to perform wear leveling features, refresh operations, and other larger scale management of the memory device. An SMU can be used for these larger scale operations because large amounts of resources could be required to perform these operations on each individual MU.

To ensure that data is not lost when an MU becomes defective, the entire SMU in which the defective MU resides can be retired from use. The SMU, or address of the SMU, can be included in a set of retired SMUs so that the system can track which SMUs should not be used to store data. However, retiring an entire SMU when only one or even a subset of the MUs of the SMU is defective can be costly because a large number of non-defective MUs can be retired as well. For example, an SMU can contain over two thousand MUs. If the SMU is retired due to only one defective MU then the cost is nearly two-thousand times more than the actual defective MU.

An MU may be identified as defective, and then the SMU in which the defective MU is grouped may be retired. But, once the SMU is retired, each of the MUs of the SMU can no longer be used for data storage. Some MUs can be restored to proper operation, but the SMUs that include the restorable MUs cannot be recovered from the set of retired SMUs.

Aspects of the present disclosure address the above and other deficiencies by determining whether the MUs of an SMU in the set of retired SMUs remain defective. If an MU is still determined to be defective, the memory sub-system can apply an appropriate program pulse to the defective bits (i.e., cells) of the MU to push or pull a voltage distribution (e.g., threshold voltage (VT)) of the media back within a proper operating range. The memory sub-system can perform a similar defective judgement operation on the MU to determine if the MU still remains defective. If the MU remains defective, then the memory sub-system can retain the SMU in the set of retired SMUs. However, the memory sub-system can perform the steps above on each MU of the SMU and if the memory sub-system determines that each MU is not defective, then the memory sub-system can remove the SMU from the set of retired SMUs.

Advantages of the present disclosure include minimizing the excessive loss of usable media from retiring SMUs with recoverable defects. In addition, the decline of user capacity can be significantly reduced, or slowed, because retired SMUs with recoverable defects are not permanently retired, and rather can be returned to use.

FIG. 1 illustrates an example computing environment 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, and a hard disk drive (HDD). Examples of memory modules include a dual in-line memory module (DIMM), a small outline DIMM (SO-DIMM), and a non-volatile dual in-line memory module (NVDIMM).

The computing environment 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. The host system 120 uses the memory sub-system 110, for example, to write data to the memory sub-system 110 and read data from the memory sub-system 110. As used herein, "coupled to" generally refers to a connection between components, which can be an indirect communicative connection or direct communicative connection (e.g., without intervening components), whether wired or wireless, including connections such as electrical, optical, magnetic, etc.

The host system 120 can be a computing device such as a desktop computer, laptop computer, network server, mobile device, embedded computer (e.g., one included in a vehicle, industrial equipment, or a networked commercial device), or such computing device that includes a memory and a processing device. The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), etc. The physical host interface can be used to transmit data between the host system 120 and the memory sub-system 110. The host system 120 can further utilize an NVM Express (NVMe) interface to access the memory components (e.g., memory devices 130) when the memory sub-system 110 is coupled with the host system 120 by the PCIe interface. The physical host interface can provide an interface for passing control, address, data, and other signals between the memory sub-system 110 and the host system 120.

The memory devices can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

An example of non-volatile memory devices (e.g., memory device 130) includes a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased.

Although non-volatile memory components such as 3D cross-point type memory are described, the memory device 130 can be based on any other type of non-volatile memory, such as negative-and (NAND), read-only memory (ROM), phase change memory (PCM), self-selecting memory, other chalcogenide based memories, ferroelectric random access memory (FeRAM), magneto random access memory (MRAM), negative-or (NOR) flash memory, and electrically erasable programmable read-only memory (EEPROM).

The cells can store one or more bits per cell. In one embodiment, each of the memory devices 130 can include one or more arrays of memory cells such as single level cells (SLCs), multi-level cells (MLCs), triple level cells (TLCs), or quad-level cells (QLCs), or a combination of such. In some embodiments, a particular memory component can include an SLC portion, and an MLC portion, a TLC portion, or a QLC portion of memory cells. Each of the memory cells can store one or more bits of data used by the host system 120. Furthermore, the memory cells of the memory devices 130 can be grouped as memory pages or memory blocks that can refer to a unit of the memory component used to store data.

The memory sub-system controller 115 can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor (processing device) 117 configured to execute instructions stored in local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 may not include a memory sub-system controller 115, and may instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical block address and a physical block address that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130.

In some embodiments, the memory devices 130 are managed memory devices (e.g., managed NAND), which is a raw memory device combined with a local controller (e.g., local controller 135) for memory management within the same memory device package.

The memory sub-system 110 includes a recovery management component 113 that can be used to recover an SMU from set of retired SMUs from the memory devices 130. In some embodiments, the controller 115 includes at least a portion of the recovery management component 113. For example, the controller 115 can include a processor 117 (processing device) configured to execute instructions stored in local memory 119 for performing the operations described herein. In some embodiments, the recovery management component 113 is part of the host system 120, an application, or an operating system.

The recovery management component 113 can identify an SMU that has been placed in a set of retired SMUs comprising an indication (e.g., address) of retired SMUs from the memory devices 130. In one implementation, the set of retired SMUs is stored in local memory 119 of the controller 115. In other implementations, the set of retired SMUs can be stored on the devices 130 themselves, or elsewhere in the computing environment 100. The recovery management component 113 can iteratively perform an operation to determine the integrity each MU of the identified SMU to determine if the MU has a failed bit count that fails to satisfy a threshold criterion (e.g., is less than a maximum allowed threshold). The recovery management component 113 can remove the SMU from the set of retired SMUs if each of the MUs of the SMU have a failure bit count less than the maximum allowed threshold. Additionally, the recovery management component 113 can perform a recovery operation to attempt to restore an MU to proper operation and then again determine if the MU is defective. Further details with regards to the operations of the recovery management component 113 are described below.

Figure 2:
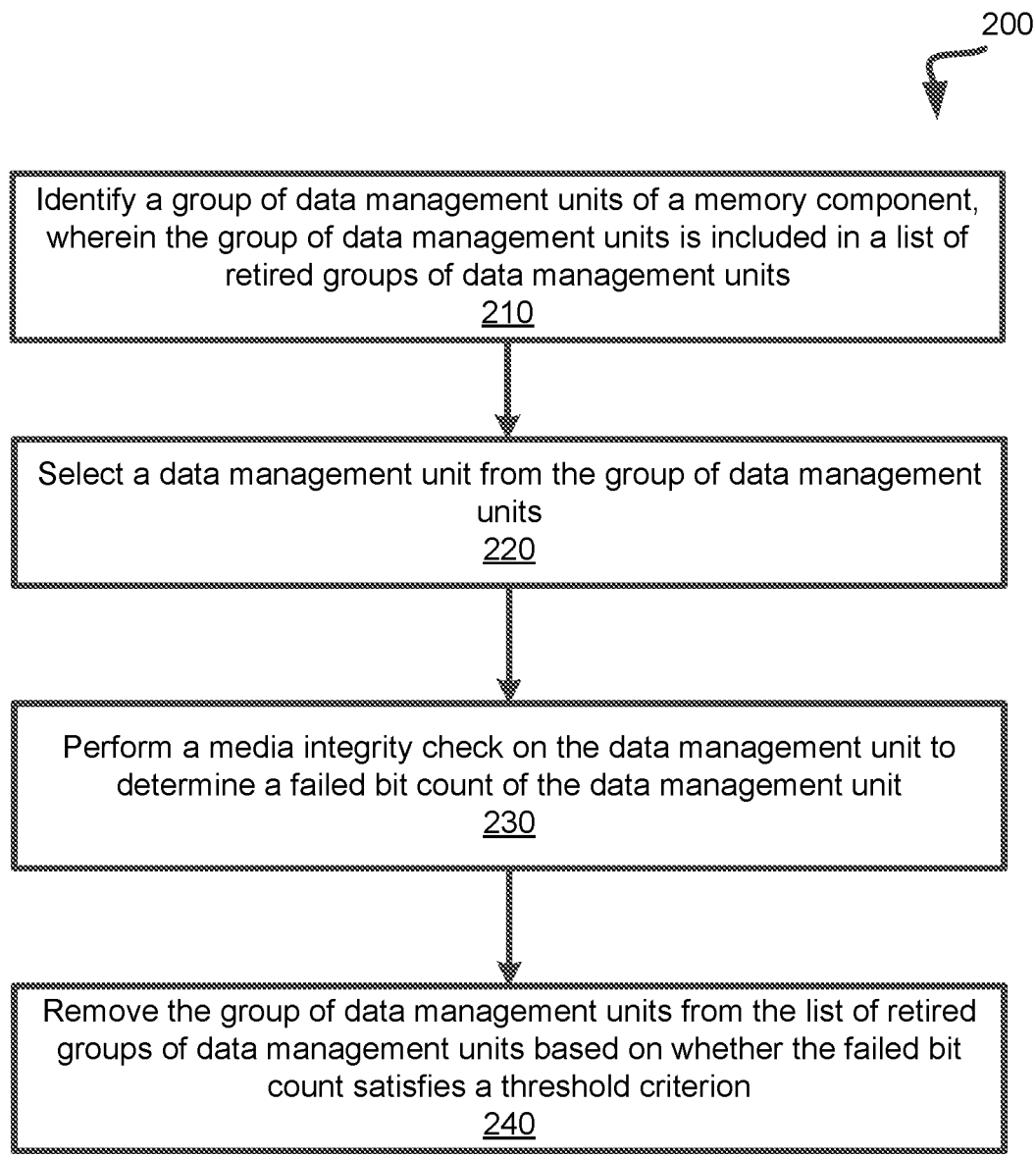
FIG. 2 is a flow diagram of an example method to recover an SMU from a set of retired SMUs in accordance with some embodiments of the present disclosure.

FIG. 2 is a flow diagram of an example method 200 to recover an SMU from a set of retired SMUs, in accordance with some embodiments of the present disclosure. The method 200 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 200 is performed by the recovery management component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 210, the processing logic identifies a group of management units included in a set of retired groups of management units (e.g., super management units (SMUs)) on at least one of the memory devices 130. The set of retired groups of management units can be a list, a table, or any other data structure, which includes indications of retired groups of management units. The set of retired groups of management units can include groups of management units that have been retired from use because at least one management unit of the group of management units has been determined to be defective. A defective management unit can include one or more defective bits, or cells, that cannot be reliably programmed. The bits may be defective due to a variety of reasons such as corner use cases in which a bit is written with the same value repeatedly until the cell's state falls outside of an operable range when programmed with that value. Another reason that a cell can become defective includes an inherent drift of the cell to a higher value/state such that it falls outside the high end of the proper operating range.

At operation 220, the processing logic selects a management unit from the group of management units. In one example, recovery management component 113 can iteratively select each management unit of the group to perform operation 230. At operation 230, the processing logic performs a media integrity check on the management unit to determine a first failed bit count of the management unit. To perform the media integrity check, the processing logic can write a random block of data to the management unit and then read the random data. The processing logic can then compare the read data to the original data that was written to determine the failed bit count. The write/read process can be repeated with the inverse of the random data to determine whether each cell can be programmed to both a high state and a low state. If a bit from a cell is incorrect from either of the read/write cycles then it is counted as a failed bit. The total failed bit count therefore refers to the number of cells of the management unit that cannot be programmed and read reliably to at least one state of the cell.

At operation 240, the processing logic removes the group of management units from the set of retired groups of management units based on whether a failed bit count satisfies a threshold criterion. The threshold criterion can be based on a defined number of failed bits that indicate whether a management unit is defective. In one example, the threshold criterion is defined such that the threshold criterion is satisfied if the failed bit count is less than a minimum threshold number of failed bits. Thus, if the failed bit count of the group of management units is below the minimum threshold number, the recovery management component 113 determines that the threshold criterion is satisfied and removes the group of management units from the set of retired groups. In this implementation, if the failed bit count of the group of management units is greater than the minimum threshold number, the recover management component 113 determines that the threshold criterion is not satisfied and keeps the group of management units in the set of retired groups.

In another example, the threshold criterion is defined such that the threshold criterion is satisfied if the failed bit count is greater than the minimum threshold number of failed bits. Thus, if the failed bit count of the group of management units is greater than (or equal to) the minimum threshold number, the recovery management component 113 determines that the threshold criterion is satisfied and keeps the group of management units in the set of retired groups. In this implementation, if the failed bit count of the group of management units is below the minimum threshold number, the recovery management component 113 determines that the threshold criterion is not satisfied and removes the group of management units from the set of retired groups.

If the processing logic determines that the management unit is not defective then the management unit can reliably store data within the correctable range of an error correcting code (ECC). In another example, if the management unit is not defective then the group of management units can be removed from the set of groups of retired management units.

Figure 3:
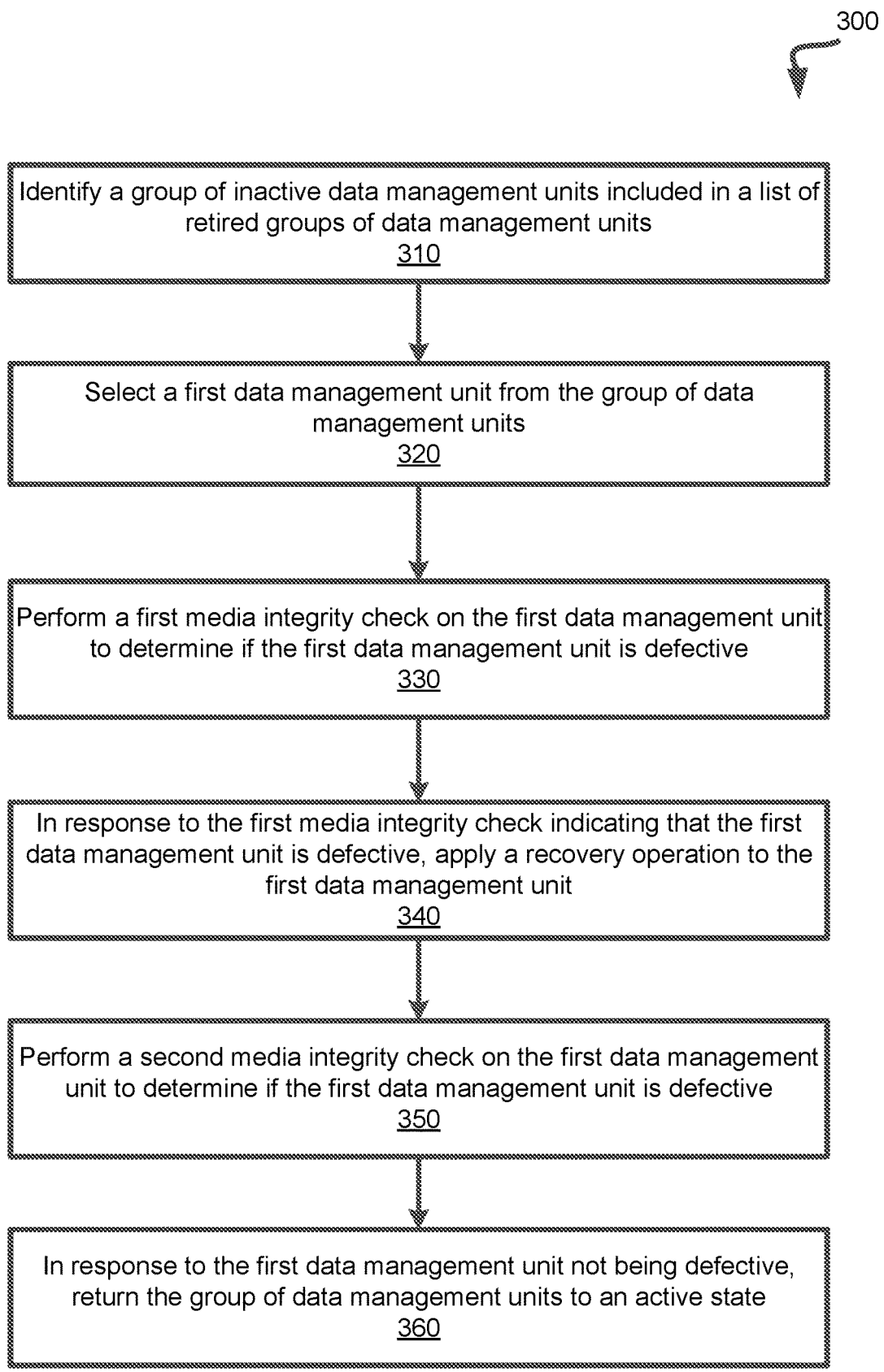
FIG. 3 is a flow diagram of an example method to manage recovery of an SMU from a set of retired SMUs in accordance with some embodiments of the present disclosure.

FIG. 3 is a flow diagram of an example method 300 to recover an SMU from a set of retired SMUs, in accordance with some embodiments of the present disclosure. The method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 300 is performed by the recovery management component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 310, the processing logic identifies a group of inactive management units included in a set of retired groups of management units (e.g., super management units (SMUs)) on at least one of memory devices 130. The set of retired groups of management units can be a list, a table, or any other data structure, which includes indications of groups of inactive management units. A group of inactive management units can be a group of management units that has been retired from use because at least one management unit of the group of management units has been determined to be defective. A defective management unit can include one or more defective bits, or cells, that cannot be reliably programmed. The bits may be defective due to a variety of reasons such as corner use cases in which a bit is written with the same value repeatedly until the cell's state falls outside of an operable range when programmed with that value. Another reason that a cell can become defective includes an inherent drift of the cell to a higher value/state such that it falls outside the high end of the proper operating range.

At operation 320, the processing logic selects a first management unit from the group of management units. In one example, the recovery management component 113 can iteratively select each management unit of the group to perform operations 330-350. At operation 330, the processing device performs a first media integrity check on the first management unit to determine if the first management unit is defective. To perform the media integrity check, the processing logic can write a random block of data to the management unit and then read the random data. The processing device and then compare the read data to the original data that was written to determine a failed bit count. This process can be repeated with the inverse of the random data to determine whether each cell can be programmed to both a high state and the low state. If a bit from a cell is incorrect from either of the read and writes then it is counted as a failed bit. A failed bit count therefore refers to the number of cells of the management unit that cannot be programmed and read reliably to at least one state. The processing logic can determine whether that management unit is defective based on a threshold criterion.

In one example, the threshold criterion is defined such that the threshold criterion is satisfied if the failed bit count is less than a minimum threshold number of failed bits. Thus, if the failed bit count of the group of management units is below the minimum threshold number, the recovery management component 113 determines that the threshold criterion is satisfied and that the management unit is not defective. In this implementation, if the failed bit count of the group of management units is greater than the minimum threshold number, the recover management component 113 determines that the threshold criterion is not satisfied and that the management unit is defective.

In another example, the threshold criterion is defined such that the threshold criterion is satisfied if the failed bit count is greater than the minimum threshold number of failed bits. Thus, if the failed bit count of the group of management units is greater than (or equal to) the minimum threshold number, the recovery management component 113 determines that the threshold criterion is satisfied and that the management unit is defective. In this implementation, if the failed bit count of the group of management units is below the minimum threshold number, the recovery management component 113 determines that the threshold criterion is not satisfied and that the management unit is not defective.

At operation 340, in response to the first media integrity check indicating that the first management unit is defective, the processing logic applies a recovery operation to the first management unit. To perform the recovery operation, the processing logic can apply a voltage to the defective cells of the management unit. The voltage can be similar to a program pulse, which can comprise a voltage that is applied to the cell for some period of time. The program pulse can include a number of characteristics such as voltage value, current, pulse width (i.e. time), etc. Therefore, the processing logic can apply an appropriate program pulse to the defective cells to attempt to pull the state of the cells back within proper operating range. For example, a cell with a state that causes a high state to exceed the high end of the proper operating range can receive a low program pulse to pull the cell's state back down within operating range. Similarly, a higher program pulse can pull a cell with a state below the low end of proper operating range back up within the proper range.

At operation 350, the processing logic performs a second media integrity check on the first management unit to determine if the first management unit is defective. The second media integrity check can be similar to the first media integrity check performed on the management unit at operation 330. In addition, the processing logic can perform the second media integrity check in response to performing the recovery operation to the first management unit. The processing logic can use the second media integrity check to determine if the recovery operation returned enough defective cells of the management unit back within proper operating range so that it no longer satisfies the threshold criterion for failed bit count (i.e., is no longer defective).

At operation 360, in response to the first management unit not being defective, the processing logic returns the group of management units to an active state. An active state can be a state in which a memory controller (e.g., controller 115) can store data at the management units included in the group of management units (e.g., in memory devices 130). To return the group of management units to an active state, the recovery management component 113 can remove the group of management units (or the address of the group of management units) from a set of retired groups of management units. In one example, if a failed bit count of the management unit satisfied a threshold criterion (e.g., exceeds a maximum allowed threshold number of failed bits) then the processing logic can determine that the management unit is defective. In another example, if the failed bit count of the management unit fails to satisfy the threshold criterion (e.g., is less than or equal to the maximum allowed threshold number of failed bits) then the processing logic can determine that the management unit is not defective. The management unit thus satisfies the threshold criterion if the failed bit count is less than the maximum failed bit count. Therefore, the management unit can reliably store data within the correctable range of an ECC. In another example, if the management unit is not defective then the processing logic can remove the group of management units from the set of groups of retired management units.

Figure 4:
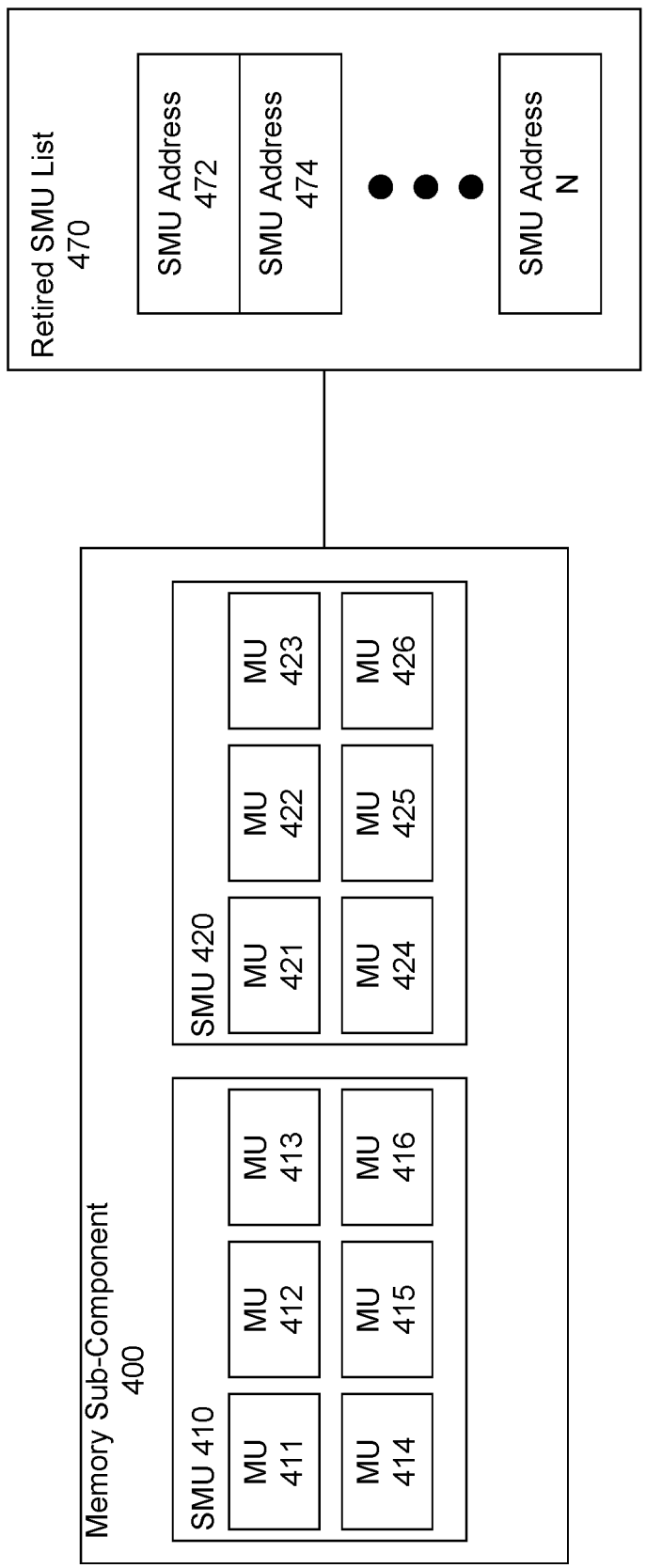
FIG. 4 illustrates an example memory component and an associated retired SMU list that is managed to recover an SMU from the retired SMU list in accordance with some embodiments of the present disclosure.

FIG. 4 is a block diagram illustrating an example memory sub-component 400 and a retired SMU list 470 associated with the memory subcomponent 400. The memory sub-component 400 can include one or more super management units (SMU) 410 and 420. Grouped into each SMU 410 and 420 can be one or more management units (MU). As depicted, each SMU can include the same number of MUs. An MU can be a page (e.g., smallest unit of data that can be written to or read from a cross-point array) of a cross-point array of non-volatile memory or a block (e.g., smallest unit of data that can be erased in flashed-based memory) of flash-based memory. SMUs can include a set of multiple MUs (e.g. 1000 MUs or more). Although a specific number of SMUs are depicted and only six MUs are depicted within each SMU, it should be noted that the memory sub-component 400 can include any number of SMUs and each SMU can include any number of MUs. The retired SMU list 470 can include each SMU, or the address of each SMU, that has been retired from use due to one or more defective MUs within the SMU. The memory controller can avoid using the SMUs in the retired SMU list 470 by referencing the addresses of the SMUs included in the retired SMU list 470. The memory controller then knows not to allocate data to the retired SMUs.

For example, SMU 410 and SMU 420 can be retired SMUs included in the retired SMU list 470. The SMUs included in the retired SMU list can be indicated by the address of the SMU. For example, retired SMU list 470 can include SMU address 472 and 474. In one example, SMU address 472 can correspond to SMU 410 and SMU address 420 can correspond to SMU 420. When included in the retired SMU list 470, none of the MUs of the SMU are used to store data. For example, if only MU 413 of SMU 410 is defective, then MUs 411, 412, 414, 415, and 416 can also be removed from use even if they are not defective. However, the SMU 410 can be removed from the retired SMU list if the defective MU 413 can be recovered and returned to proper operating status. In one example, a recovery management component (i.e., recovery management component 113) can, after a defined period of time, select the SMU 410 and then determine if each of the MUs 411-416 are defective or not. If an MU 411-416 is defective then a recovery operation, such as a program pulse, can be applied to the defective cells of the MU 411-416. The recovery management component can then again determine if the MU is defective. If any of the MUs 411-416 remain defective then the SMU 410 will not be removed from the retired SMU list 470. Otherwise, if none of the MUs 411-416 are determined to be defective then the SMU 410 can be removed from the retired SMU list 470. This process can be repeated for each of the SMUs in the retired SMU list 470 (e.g., SMU 420, etc). The process for recovery management of the retired SMU list 470 is described in further detail below with respect to FIG. 5.

Figure 5:
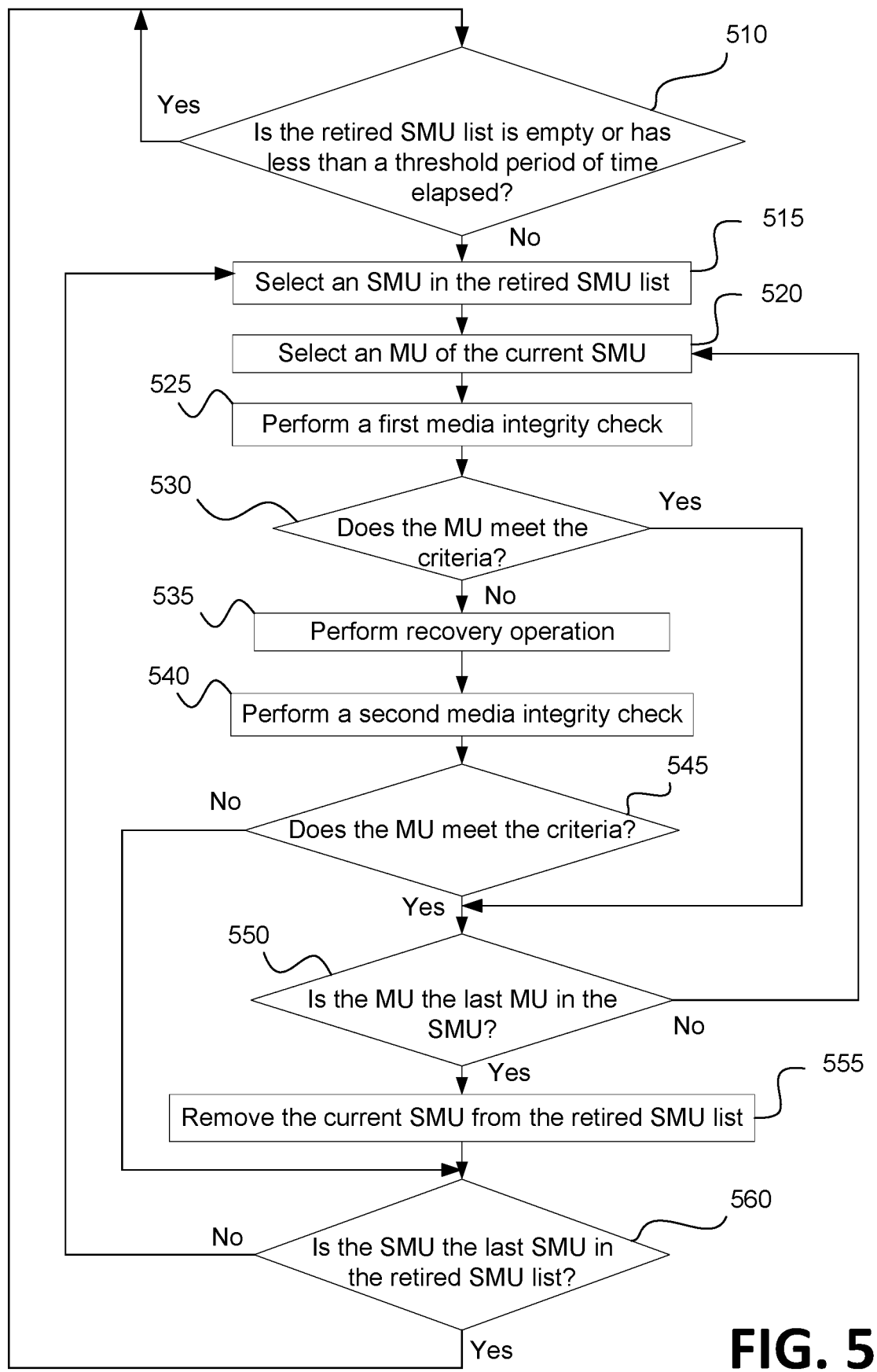
FIG. 5 is a flow diagram of an example method to recover retired SMUs that are no longer defective from the retired SMU list in accordance with some embodiments of the present disclosure.

FIG. 5 is a flow diagram of an example method 500 to recover an SMU from the retired SMU list, in accordance with some embodiments of the present disclosure. The method 500 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 500 is performed by the recovery management component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 510, the processing logic determines whether the retired SMU list (e.g., retired SMU list 470) is empty. If recovery management component 113 determines that the retired SMU list 470 is empty (i.e., does not currently include any retired SMUs), processing returns to operation 510 where the status of the retired SMU list 470 is continuously or periodically monitored. In addition, the processing logic determines if less than a threshold amount of time has elapsed since the recovery management component 113 last attempted recovery of the SMUs from the retired SMU list 470. In some forms of memory (e.g., in a cross-point array), the voltage of bits or cells can inherently drift higher over time. Therefore, the threshold amount of time can represent a minimum amount of time that can be allowed for bits below proper operating range to drift back into the proper operating range. If recovery management component 113 determines than less than the threshold amount of time has elapsed, processing returns to operation 510 where the amount of time is continuously or periodically monitored.

If recovery management component 113 determines that the retired SMU list 470 is not empty and that less than the threshold amount of time has not elapsed (i.e., that a minimum amount of time has elapsed), at operation 515, the processing logic selects an SMU (e.g., SMU 420 corresponding to SMU Address 472) in the retired SMU list 470 to determine whether that SMU should be removed from the retired SMU list. To remove an SMU from the list, recovery management component 113 can determine that each MU of the SMU is not defective. At operation 520, the processing logic selects an MU (e.g., MU 411) of the currently selected SMU 410 to determine if that particular MU 411 has been, or can be recovered.

At operation 525, the processing logic performs a first media integrity check on the selected MU 411. To perform the media integrity check, the recovery management component 113 can write a random block of data to the MU 411 and then read the data to determine a failed bit count (i.e., the number of bits read that don't match the original data that was written). In addition, the recovery management component 113 can perform a second write and read operation with the inverse of the random block of data to determine whether each cell of the MU 411 can program and read data in both possible states (and thus reliably write and read data). The failed bit count can be the total number of cells that are defective as determined from both write and read cycles.

At operation 530, the processing logic can determine whether the currently selected MU 411 of the currently selected SMU 410 satisfies a reliability criterion. The reliability criterion can be a maximum number of bits that can be defective, and therefore the criterion is not satisfied if the failed bit count exceeds the maximum number of defective bits. If the reliability criterion is satisfied (e.g., the failed bit count is less than the maximum allowed number of defective bits) then MU 411 is not defective and processing can move to operation 550, below. Otherwise, if the MU does not yet satisfy the criterion processing continues to operation 535.

At operation 535, the processing logic performs a recovery operation on the selected MU 411. The recovery operation can include applying a voltage to the defective cells of the MU 411 to pull them within proper operating range. The voltage can be a program pulse with a specified voltage, width, and current to pull the defective cells within range. For example, if the defective cell's state is below proper operating range then the program pulse can have a high voltage to pull the cell's state up into the proper range. Alternatively, if the state of the cell is higher than the proper range then the program pulse can be low to pull the cell back down within the proper range.

At operation 540, the processing logic performs a second media integrity check to determine a new failed bit count after performing the recovery operation. Again, the processing logic can perform a first write/read cycle with random data followed by a second write/read cycle with the inverse of the random data. The number of defective bits (failed bit count) can then be determined from the mismatched bits of the read data to the data that was written.

At operation 545, the processing logic again determines whether the selected MU 411 satisfies the reliability criterion after the recovery operation has been performed. This operation can take place just as in operation 530. In one example, the recovery operation restores enough defective bits that the criterion is satisfied and thus the MU 411 can be determined not to be defective. However, in some instances the cells of the MU 411 can be damaged such that they are not recoverable. Therefore, in these instances the criterion may not be satisfied, and thus the MU 411 remains defective. If the MU 411 remains defective then the SMU 410 remains in the retired SMU list 470 and processing continues on to operation 560 to determine if any additional SMUs remain in the list. If the MU 411 is determined not to be defective then processing proceeds to operation 550.

At operation 550, the processing logic determines if the MU 411 is the last MU in the currently selected SMU 410. If it is the last MU then processing proceeds to operation 555. At operation 555, the processing device removes the current SMU out of the retired SMU list. Otherwise, if the MU 411 is not the last MU in the SMU 410 then processing returns to operations 520 to select the next MU (e.g., MU 412) of the current SMU 410. The processing logic then repeats operations 525-550. Operations 525-550 can be repeated for each MU (e.g., 413-416) in the SMU 410 if each MU 411-416 is not defective, in which case the SMU 410 is removed from the retired SMU list 470.

At block 560, the processing logic determines whether the current SMU 410 is the last SMU that was in the retired SMU list 470. If the current SMU 410 is the last SMU in the list then the processing logic determines not to perform any further recovery management operations at the current time. However, if the current SMU 410 is not the last SMU in the list then processing returns to operation 515 to select the next SMU (e.g., SMU 420) and the operations 520-555 are then repeated for the MUs (e.g., MU 421-426) in the newly selected SMU 420. Therefore, each SMU in the list is checked and the MUs within each SMU are checked to determine if the SMU includes at least one defective MU.

Figure 6:
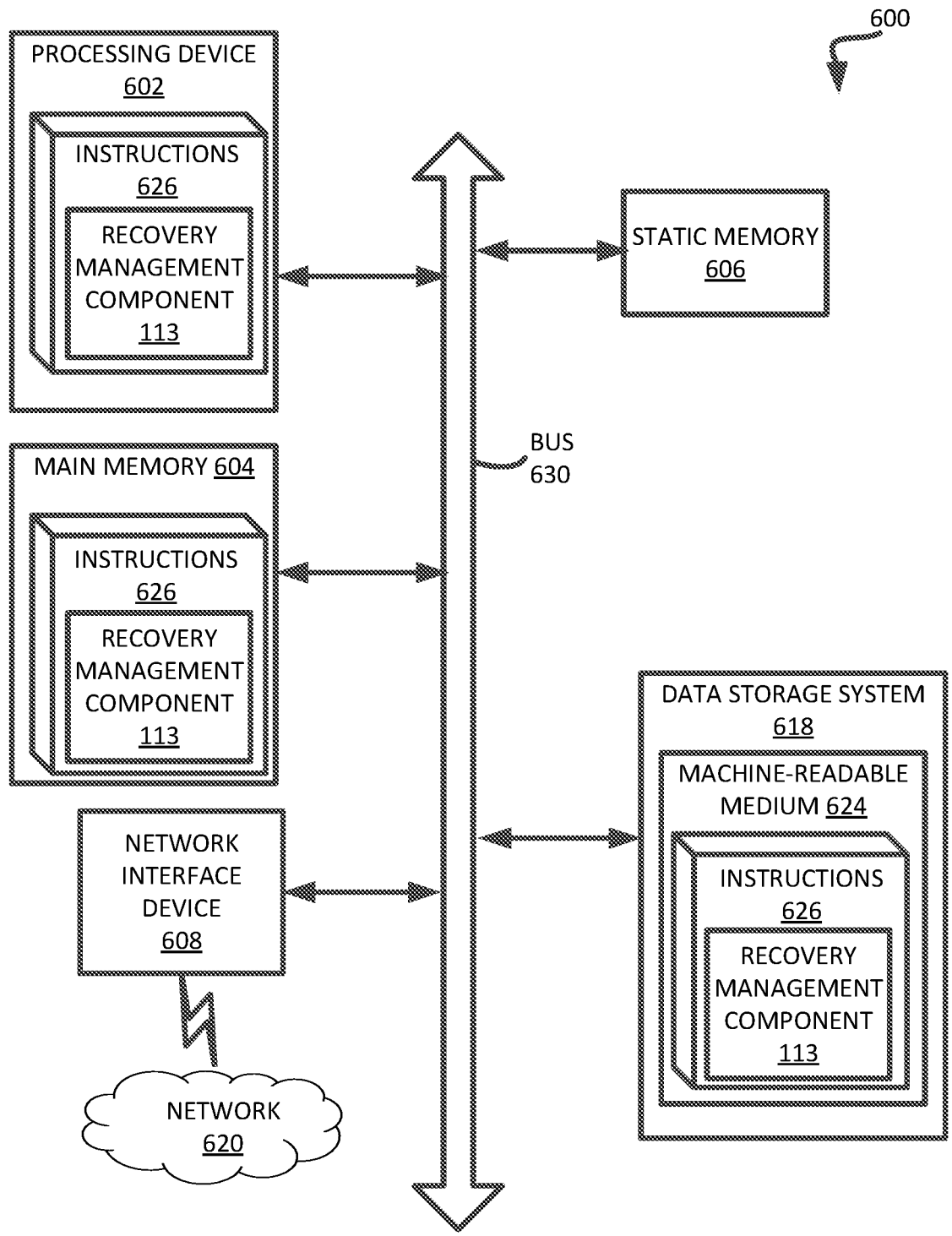
FIG. 6 is a block diagram of an example computer system in which embodiments of the present disclosure may operate.

FIG. 6 illustrates an example machine of a computer system 600 within which a set of instructions, for causing the machine to perform any one or more of the methodologies discussed herein, can be executed. In some embodiments, the computer system 600 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the recovery management component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), etc.), and a data storage system 618, which communicate with each other via a bus 630.

Processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 600 can further include a network interface device 608 to communicate over the network 620.

The data storage system 618 can include a machine-readable storage medium 624 (also known as a computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory sub-system 110 of FIG. 1.

In one embodiment, the instructions 626 include instructions to implement functionality corresponding to a recovery management component (e.g., the recovery management component 113 of FIG. 1). While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
   a memory component; and
   a processing device, operatively coupled with the memory component, to:
   responsive to determining that a threshold amount of time has elapsed since a recovery operation attempted to recover a first group of management units in a set of retired groups of management units, identifying a second group of management units in the set of retired groups of management units;

for each management unit of the second group of management units, perform a media integrity check on the respective management unit to determine whether the respective management unit satisfies a reliability criterion, wherein satisfying the reliability criterion indicates that a number of defective bits of the respective management unit is below a maximum allowed number of defective bits; and responsive to determining that each management unit of the second group of management units satisfies the reliability criterion, remove the second group of management units from the set of retired groups of management units.

2. The system of claim 1, wherein the set of retired groups of management units includes at least one management unit indicated as defective.

3. The system of claim 1, wherein to perform the media integrity check the processing device is to:

write a set of random data to the management unit;
read the set of random data from the management unit; and
determine a failed bit count, based on the read, wherein the failed bit count indicates a number of bits that were not properly read from the management unit.

4. The system of claim 3, wherein to perform the media integrity check the processing device is further to:

write an inverse of the set of random data to the management unit;
read the inverse of the set of random data from the management unit; and
determine the failed bit count based on the read of the set of random data and the read of the inverse of the set of random data.

5. The system of claim 3, wherein the processing device is further to:

responsive to determining that each management unit of the second group of management units does not satisfy the reliability criterion, performing a recovery operation for each management unit that does not satisfy the reliability criterion.

6. The system of claim 5, wherein to perform the recovery operation includes applying a voltage to one or more defective cells of the management unit, wherein the voltage is applied as a modified program pulse.

7. The system of claim 5, wherein to perform the media integrity check the processing device is further to:

responsive to performing the recovery operation, performing a subsequent media integrity check on the management unit to determine whether the respective management unit satisfies the reliability criterion.

8. A method comprising:

responsive to determining that a threshold amount of time has elapsed since a recovery operation attempted to recover a first group of management units in a set of retired groups of management units, identifying a second group of management units in the set of retired groups of management units;

for each management unit of the second group of management units, perform a media integrity check on the respective management unit to determine whether the respective management unit satisfies a reliability criterion, wherein satisfying the reliability criterion indicates that a number of defective bits of the respective management unit is below a maximum allowed number of defective bits; and responsive to determining that each management unit of the second group of management units satisfies the reliability criterion, remove the second group of management units from the set of retired groups of management units.

9. The method of claim 8, wherein the set of retired groups of management units includes at least one management unit indicated as defective.

10. The method of claim 8, wherein to perform the media integrity check includes writing a set of random data to the management unit, reading the set of random data from the management unit, and determining a failed bit count, based on the read, wherein the failed bit count indicates a number of bits that were not properly read from the management unit.

11. The method of claim 10, wherein to perform the media integrity check further includes writing an inverse of the set of random data to the management unit, reading the inverse of the set of random data from the management unit, and determining the failed bit count based on the read of the set of random data and the read of the inverse of the set of random data.

12. The method of claim 8, further comprising:

responsive to determining that each management unit of the second group of management units does not satisfy the reliability criterion, performing a recovery operation for each management unit that does not satisfy the reliability criterion.

13. The method of claim 12, wherein to perform the recovery operation includes applying a voltage to one or more defective cells of the management unit, wherein the voltage is applied as a modified program pulse.

14. The method of claim 12, further comprising:

responsive to performing the recovery operation, performing a subsequent media integrity check on the management unit to determine whether the respective management unit satisfies the reliability criterion.

15. A non-transitory computer-readable medium comprising instructions that, responsive to execution by a processing device, cause the processing device to perform operations comprising:

responsive to determining that a threshold amount of time has elapsed since a recovery operation attempted to recover a first group of management units in a set of retired groups of management units, identifying a second group of management units in the set of retired groups of management units;

responsive to not satisfying a media integrity check of a management unit of the second group of management units that are determined to be defective, performing a recovery operation on the management unit;

performing a subsequent media integrity check on the management unit to determine whether the management unit satisfies a reliability criterion, wherein satisfying the reliability criterion refers to a number of defective bits of the respective management unit being below a maximum allowed number of defective bits; and responsive to determining that each management unit of the second group of management units satisfies the reliability criterion, remove the second group of management units from the set of retired groups of management units.

16. The non-transitory computer-readable medium of claim 15, wherein the set of retired groups of management units includes at least one management unit indicated as defective.

17. The non-transitory computer-readable medium of claim 15, wherein to perform the recovery operation on the respective management unit of the second group management units includes applying a voltage to one or more defective cells of the management unit, wherein the voltage is applied as a modified program pulse.

* * * * *